United States Patent [19]

Zimmerman

[11] Patent Number: 4,631,572
[45] Date of Patent: Dec. 23, 1986

[54] MULTIPLE PATH SIGNAL DISTRIBUTION TO LARGE SCALE INTEGRATION CHIPS

[75] Inventor: Thomas A. Zimmerman, Rancho Palos Verdes, Calif.

[73] Assignee: TRW Inc., Redondo Beach, Calif.

[21] Appl. No.: 536,129

[22] Filed: Sep. 27, 1983

[51] Int. Cl.$^4$ .................... H01L 23/02; H01L 23/16; H01L 39/02

[52] U.S. Cl. ....................... 357/74; 357/75; 357/80

[58] Field of Search ............ 357/74, 75, 80; 361/404, 405, 407; 174/52 FP

[56] References Cited

U.S. PATENT DOCUMENTS

| | | | |
|---|---|---|---|
| 3,872,583 | 3/1975 | Beall et al. | 357/80 |
| 3,908,185 | 9/1975 | Martin | 357/74 |
| 4,067,040 | 1/1978 | Tsuzuki et al. | 357/74 |
| 4,255,672 | 3/1981 | Ohno et al. | 357/51 |
| 4,531,145 | 7/1985 | Wiech, Jr. | 357/80 |

FOREIGN PATENT DOCUMENTS

| | | | |
|---|---|---|---|
| 31672 | 3/1977 | Japan | 357/74 |
| 36468 | 4/1978 | Japan | 357/74 |

*Primary Examiner*—William L. Sikes
*Assistant Examiner*—Frank González
*Attorney, Agent, or Firm*—Noel F. Heal; Donald R. Nyhagen; Robert J. Stern

[57] ABSTRACT

An integrated circuit package has a conductive ring surrounding the integrated circuit substrate and optionally, over the integrated circuit itself, and wires connected between selected chip pads and adjacent portions of the surrounding ring, the surrounding ring being connected to only one of a plurality of external conductive pins of the chip package, the remainder of the external pins being connected to other selected chip pads.

4 Claims, 2 Drawing Figures

MULTIPLE PATH SIGNAL DISTRIBUTION TO LARGE SCALE INTEGRATION CHIPS

RELATED UNITED STATES GOVERNMENT CONTRACT

The United States Government has an interest in this invention under Department of Defense Contract Number N00039-81-C-0414.

BACKGROUND OF THE INVENTION

In large scale integration, integrated circuits comprising semiconductor "chips" are mounted on a circuit package and the various input/output ports of the integrated circuit are connected individually to external pins which protrude from the package and afford interconnection with other systems. Thus, the number of different signals which can be coupled as input or output to the integrated circuit is limited by the number of pins in the integrated circuit package.

With recent developments in large scale integration, the number of pins ("pin-out") has become a design critical item. Specifically, in high precision digital signal processing integrated circuits, the number of bits per word is increasing from 8 bits to as high as 32 bits per word for maximum precision. The next largest procaseo industry standard pin-out for integrated circuit packages now stands a 132 pins. However, in the case of a simple multiplication operation performed on-chip for two 32-bit words, a total of 128 pins is required, which leaves only 4 pins out of 132 for control and power, an unacceptable situation. Accordingly, a design rule that has been practiced in this art is to assign just one pin for each different input/output signal to be coupled to or from the chip. Using more than one pin for any given input/output signal would be considered a "waste" of the extra pins used. In the example of the 32-bit multiplier, there would most likely be no extra pins. Hence the importance of the design rule.

The effect of this has been to severely restrict the ability of the circuit designer to optimize the chip layout. Specifically, all circuits which are connected to a given input/output signal, wherever they may be located on the chip, must be connected to the same input/output port on the chip. The input/output port is typically a metal pad located on the periphery of the chip. For example, if a particular voltage must be applied to various circuits throughout the chip, a conductive bus carrying that voltage must extend on the chip for fairly long distances, comparable to the length of the chip. In order to avoid voltage drops along the length of the bus, the width of the bus must be quite large. Otherwise, the voltage applied to various circuits could vary widely, depending upon their location on the chip. Widening the bus necessarily consumes real estate on the chip, thus limiting the space available for different circuit functions on the chip.

One solution to this problem would be to connect both ends of the bus to the voltage source. This would allow the bus width to be decreased by a factor of four without suffering additional voltage drops along the length of the bus. This solution requires that the two ends of the bus be connected to two pads which are nearest the ends of the buse and that the two corresponding external pins be connected to the same voltage source, thus violating the design rule discussed above.

One obvious solution to all of the foregoing is simply to increase the number of external pins on the integrated circuit package. However, this is unacceptable because the greater number of pins would require a reduction in pin-to-pin spacing and an increase in the amount of cross-talk or capacitive coupling between various input/output ports of the chip. Furthermore, at present the commerical availability of such large pin-out circuit packages is limited.

Accordingly, there has existed two apparently irreconcilable goals in the art. The first goal has been to maximize the number of different input/output signals coupled to the integrated circuit chip for a given number of pins on the circuit package, which requires that each pin be used to couple a different input/output signal to the chip. The second goal has been to conserve chip "real estate" to afford the placement of more functions on a given chip. This in turn has required the reduction in dimensions of, for example, the conductive busses carrying signals and supply voltages to or from various portions of the chip. However, such reduction in bus geometry requires the unacceptable duplication of pin-out to permit connection of a signal to both ends of a corresponding bus to minimize voltage drops along the length of the bus. So far, for a given integrated circuit package pin-out and a given chip size, it has not been possible to simultaneously meet both goals without a trade-off.

SUMMARY OF THE INVENTION

In the present invention, the bus width is reduced while avoiding voltage drops along the bus length by applying the signal to be carried by the bus at two or more points along the length of the bus. However, the necessity of the signal applied to that bus being carried by more than one external pin is eliminated, thus avoiding the trade-off discussed above. This is accomplished by means of one or more conductive rings at least partially surrounding the chip and being patterned on the integrated circuit package at the same time the usual circuit package contacts are patterned. Each conductive ring is connected to two or more integrated circuit contacts but only one package pin. Because of the extra space available on the integrated circuit package, the width of the ring is sufficiently large so that voltage drops along its length are significantly reduced if not virtually eliminated. Selected chip pads at any location along the chip periphery may be connected to the nearest point along the surrounding conductive ring on the chip package.

Preferably, the ring is adjacent and surrounds the chip so that virtually any pad may be connected to the ring. Furthermore, the number of pads so connected is not limited. Accordingly, any conductive bus on the integrated circuit chip may be connected at various points along its length to various nearby pads, each of these nearby pads being connected in turn to nearby points on the surrounding conductive ring. Accordingly, the bus width may be of extremely small dimensions without incurring significant voltage drops. This in turn saves real estate on the chip, thus permitting additional circuit functions to be formed on the chip to increase its versatility. As an example, as bus which has an applied voltage connected at only one of its ends must be four times as wide as a bus of the same length having the same voltage applied at both of its ends for the same voltage drop along its length. Thus, the invention can permit a 3- or 4-fold decrease in bus width.

In the preferred embodiment of the invention, there is one surrounding conductive bus on the integrated circuit package adjacent the chip and this surrounding ring is connected in turn to a single one of the integrated circuit package pins. Selected chip pads are wire-bonded to adjacent points on the surrounding conductive ring.

Multiple independent surrounding conductive busses are equally feasible.

DESCRIPTION OF THE FIGURES

The invention is best understood by reference to the accompanying drawings, in which.

DETAILED DESCRIPTION

Figure 1:
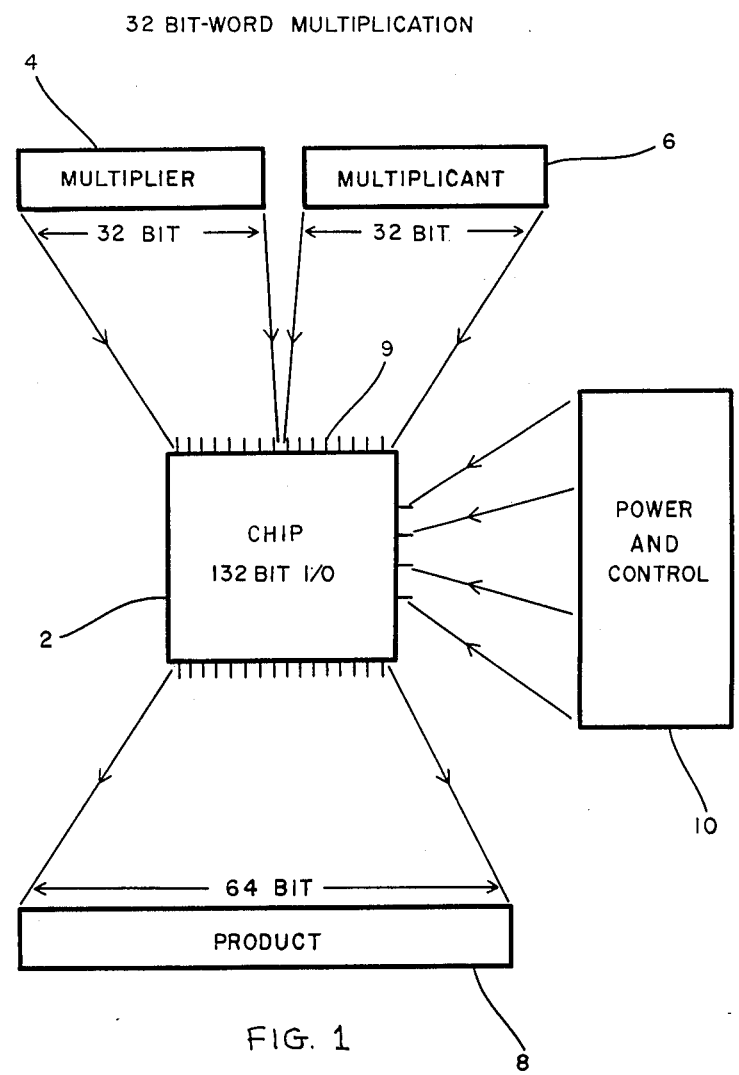
FIG. 1 is a simplified block diagram illustrating a well-known problem in the prior art of the required pin-out for a 32-bit word multiplication.

FIG. 1 illustrates the pin-out required for a chip package 2 to perform a typical binary multiplication of two 32-bit words 4, 6 to generate a 64-bit product word 8, each bit requiring an individual external pin 9 on the chip package 2 for connection. This leaves only four additional pins for connection to power and control 10, assuming the total pin-out of the chip package 2 in FIG. 1 is 132, which is equal to the proposed next largest industry standard. Of course, FIG. 1 is only an example and the connection of power and control 10 to the chip package 2 may require more than 4 pins. What FIG. 1 establishes is that there are many cases in which the pin-out is so critical that each pin on the package 2 must be used to connect a different signal to the chip without duplication.

Figure 2:
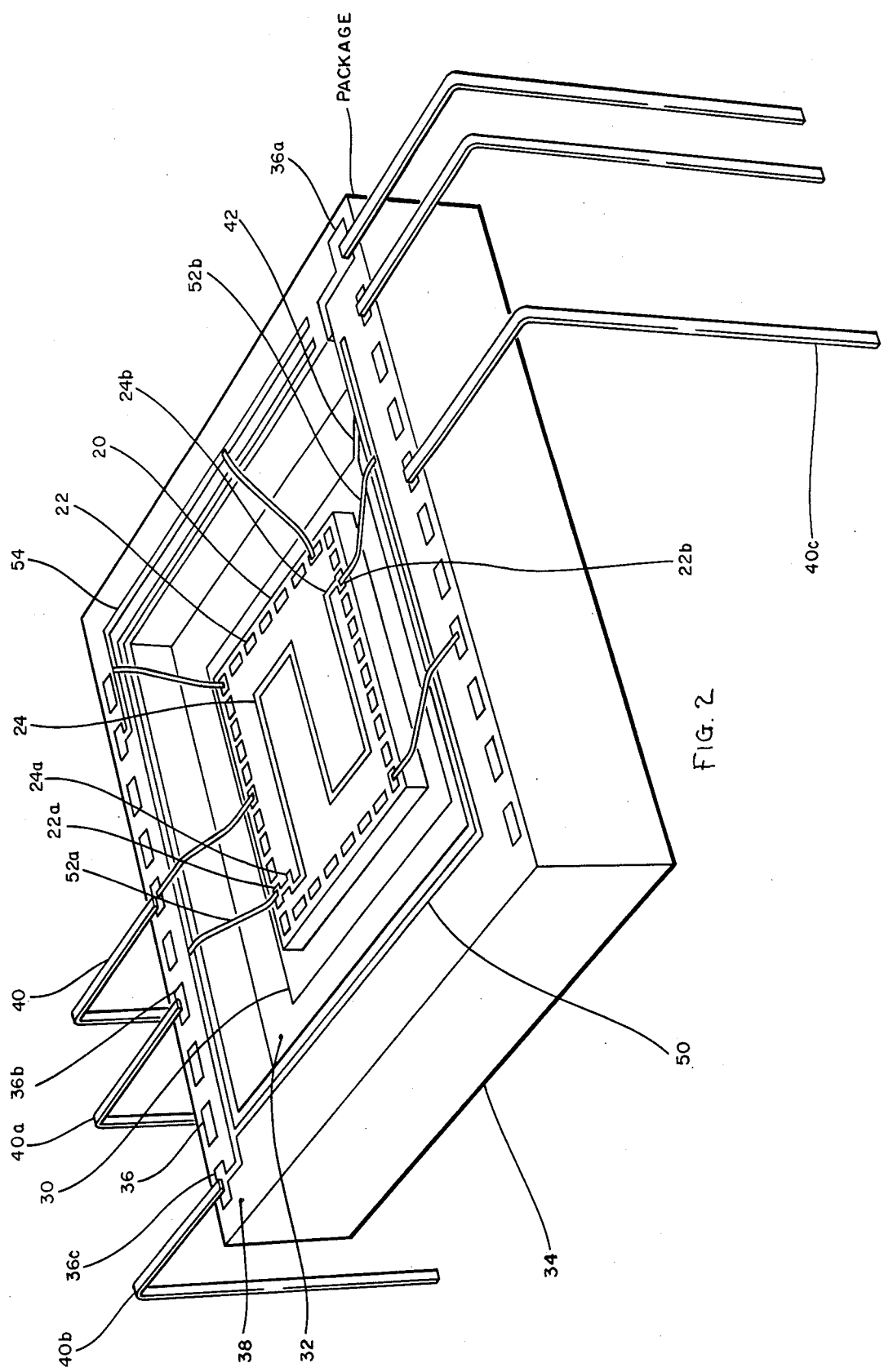
FIG. 2 is a simplified perspective view illustrating the invention.

FIG. 2 illustrates a semiconductor chip 20 embodying a large scale integrated circuit having input/output ports comprising a plurality of conductive pads 22 located on its top surface along its periphery, the pads 22 surrounding complex integrated circuitry defined in thin film layers on the top surface thereof. The integrated circuit 20 is mounted on a thin metal film 30 deposited on a recessed floor 32 of a chip package 34. The chip package 34 typically comprises an insulator material such as plastic or alumina or other ceramic, as is well known in th art.

Many of the elements on the chip 20 require a common supply voltage to be connected to each of them, thus requiring the supply voltage to be distributed throughout the top surface of the chip 20. This is accomplished by means of a conductive bus 24 defined in one of the same thin film layers, the bus meandering about the top surface of the chip 20. In the prior art, one end 24(a) of the bus 24 would be connected to the nearest pad 22(a) only. Accordingly, the width of the bus must be sufficiently large in order to avoid unacceptable voltage drops along the length of the bus.

The width of the bus 24 can be reduced without increasing such voltage drops by connecting the opposite end 24(b) of the bus 24 to another nearby pad 22(b), which would in turn be connected to the same supply voltage to which the first pad 22(a) is connected. In this case, the width of the bus 24 can be reduced by a factor of four for a given voltage drop per-unit length along the bus 24. However, the prior art requires the dedication of two external circuit package pins to carry the same supply voltage to the bus 24 where both ends of the bus 24 are connected to two different pads as shown in FIG. 2. As discussed previously in connection with FIG. 1, there are many cases in which the use of more than one external pin to carry the same signal or voltage is unacceptable because there are no extra pins or at least the margin of pin-out is extremely limited.

External connection of the pads 22 is achieved by forming or patterning a plurality of conductive bases 36 on the surface of a raised floor 38 surrounding the recessed floor 32. Each conductive base 36 is associated with an external pin 40 which is bonded on to the corresponding conductive base 36. In an alternative embodiment, the conductive film 30 on which the integrated circuit 20 rests acts as a ground plane and is connected to one of the conductive bases 36(a) located at one corner of the raised floor 38.

In the prior art, the pad 22(a) is connected to the nearest conductive base 36(b) by a thin wire and the corresponding pin 40(a) is connected to the supply voltage to be carried by the bus 24. The trade-off is immediately apparent because either: (A) the width of the bus 24 must be disadvantageously large to minimize resistive losses, or (B) the opposite bus end 24(b) must be connected through the pad 22(b) and an additional pin 40(c) to the same supply voltage to which the pin 40(a) is connected (thus using more than one pin for the same voltage).

In the present invention, this trade-off is avoided by means of a surrounding conductive ring 50 which is patterned or formed at the same time the conductive bases 36 are formed on the raised floor 38. The surrounding ring 50 is integrally formed with one of the bases 36(c) which is bonded to a pin 40(b). The width of the surrounding conductive ring 50 is sufficiently large so that there are no significant voltage drops along its length. As illustrated in FIG. 2, both ends 24(a), 24(b) of the bus 24 are connected to the corresponding pads 22(a) 22(b) through wires 52(a) 52(b) to different nearby points on the conductive ring 50. As described previously, the double-ended connection of the bus 24 to the supply voltage or signal applied to the pin 40(b) permits a four-fold reductin in the width of the bus 24. If the integrated circuit 20 has a plurality of such busses, the resulting savings in space on the chip is potentially enormous.

While the number of pins 40 formed on the package is necessarily limited by considerations described previously, the number of chip pads 22 is at the discretion of the circuit designer. Accordingly, many such busses similar to the bus 24 may be formed on the chip and may be connected to a plurality of points through various ones of the pads 22 to the ring 50 to permit a significant decrease in bus geometry and attendant savings in space on the chip without increasing the required pin-out. The extra space thus saved may be occupied by additional integrated circuitry, thus increasing the versatility of the chip.

In another embodiment of the invention, a second surrounding conductive ring 54 may be provided and used in the same manner that the surrounding conductive ring 50 is used as illustrated in FIG. 2. Although the presently preferred embodiment includes only one such surrounding conductive ring 50, it is contemplated that a plurality of such rings may be provided and would be limited in number only by the available space on the raised floor 38. A surrounding ring may also be provided on the bottom floor 32 or elsewhere near the chip 20.

What is claimed is:

1. A multiple path signal distribution system for integrated chip packages comprising:
   an integrated circuit chip package substrate having an area at one side of the substrate on which an integrated circuit chip may be mounted;
   a ring conductor having an exposed surface at said one side of said substrate at least partially surrounding said substrate area between the substrate area and the edge of said substrate, whereby a chip mounted on said area may be electrically connected to said ring conductor at any selected position therealong by at least one conductor such as a wire extending across said one side of the substrate and directly bonded at one end to said exposed ring conductor surface and at its other end to the chip;
   a plurality of conductive bases at said one side of said substrate between said ring conductor and the edge of the substrate whereby each base may be electrically connected to said chip by a conductor such as a wire extending across said one side of the substrate and bonded at one end to the base and at the other end to the chip; and
   a plurality of external connection pins about the edge of said substrate including at least one pin bonded directly to said ring conductor surface and additional pins bonded to said conductive bases, respectively.

2. The subject matter of claim 1 wherein said substrate comprises one piece structure having a lower level floor and a raised ledge surrounding said floor;
   said substrate area is located on said lower level floor; and
   said ring conductor is located on said ledge.

3. In combination:
   an integrated circuit chip package substrate having an area at one side of the substrate on which an integrated circuit chip may be mounted;
   an integrated circuit chip mounted on said substrate area and having a plurality of pads exposed at one side of the substrate;
   a first ring conductor having an exposed surface at said one side of said substrate at least partially surrounding said chip and substrate area between the substrate area and the edge of said substrate;
   a plurality of conductive bases at said one side of said substrate between said ring conductor and the edge of the substrate;
   a plurality of external connection pins about the edge of said substrate;
   at least one conductor such as a wire extending across said side of the substrate and directly bonded at one end of to said exposed ring conductor surface and at its other end to a selected chip pad;
   additional connectors such as wires extending across said one side of the substrate and each bonded at one end to a substrate base and at is other end to a chip pad;
   an integrated circuit bus conductor extending across the chip, said bus conductor having at least two ends connected to separate chip pads, respectively; and
   conductors such as wires extending across said one side of the substrate and bonded directly to said latter chip pads, respectively, and to said ring conductor.

4. The subject matter of claim 1 including:
   an additional ring conductor between said substrate area and said substrate bases having a surface exposed at said one side of said substrate, whereby the chip mounted on said substrate area may be electrically connected to said additional ring connector by at least one conductor such as a wire extending across said one side of the substrate and directly bonded at one end to said additional ring conductor surface and at its other end to the chip.

* * * * *